United States Patent
Hyakutake

(10) Patent No.: US 10,916,456 B2
(45) Date of Patent: Feb. 9, 2021

(54) SUBSTRATE LIQUID PROCESSING APPARATUS AND SUBSTRATE LIQUID PROCESSING METHOD

(71) Applicant: Tokyo Electron Limited, Tokyo (JP)

(72) Inventor: Hironobu Hyakutake, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/826,886

(22) Filed: Nov. 30, 2017

(65) Prior Publication Data

US 2018/0158701 A1 Jun. 7, 2018

(30) Foreign Application Priority Data

Dec. 2, 2016 (JP) .................. 2016-235382

(51) Int. Cl.
*H01L 21/67* (2006.01)
*H01L 21/306* (2006.01)
*H01L 21/677* (2006.01)
*H01L 21/673* (2006.01)

(52) U.S. Cl.
CPC .. *H01L 21/67086* (2013.01); *H01L 21/30604* (2013.01); *H01L 21/67028* (2013.01); *H01L 21/67057* (2013.01); *H01L 21/67173* (2013.01); *H01L 21/67207* (2013.01); *H01L 21/67303* (2013.01); *H01L 21/67309* (2013.01); *H01L 21/67718* (2013.01); *H01L 21/67757* (2013.01); *H01L 21/67766* (2013.01); *H01L 21/67781* (2013.01)

(58) Field of Classification Search
CPC .................. H01L 21/67057; H01L 21/67086
See application file for complete search history.

(56) References Cited

U.S. PATENT DOCUMENTS

2010/0223805 A1\* 9/2010 Hyakutake ........ H01L 21/67028
34/427
2018/0082834 A1\* 3/2018 Chen ................. H01L 21/67757

FOREIGN PATENT DOCUMENTS

JP 2015-056631 A 3/2015

\* cited by examiner

*Primary Examiner* — Karla A Moore
*Assistant Examiner* — Nathan K Ford
(74) *Attorney, Agent, or Firm* — Pearne & Gordon LLP

(57) ABSTRACT

A substrate liquid processing apparatus includes a placing unit which places thereon a substrate; a liquid processing unit which processes the substrate by immersing the substrate in a processing liquid with a posture in which a plate surface of the substrate is perpendicular to a horizontal direction; a transfer unit which transfers the substrate between the placing unit and the liquid processing unit; and a rotating unit which rotates the substrate, after being subjected to a first processing by the liquid processing unit, around an axis perpendicular to the plate surface, and in a direction different from that when the first processing is performed. Further, the transfer unit transfers the substrate, after being subjected to the first processing, to the rotating unit and transfers the rotated substrate to the liquid processing unit. The liquid processing unit performs a second processing by immersing the rotated substrate in the processing liquid.

11 Claims, 10 Drawing Sheets

SUBSTRATE LIQUID PROCESSING APPARATUS AND SUBSTRATE LIQUID PROCESSING METHOD

CROSS-REFERENCE TO RELATED APPLICATION

This application claims the benefit of Japanese Patent Application No. 2016-235382 filed on Dec. 2, 2016, the entire disclosures of which are incorporated herein by reference.

TECHNICAL FIELD

The embodiments described herein pertain generally to a substrate liquid processing apparatus and a substrate liquid processing method.

BACKGROUND

Conventionally, there is known a substrate liquid processing apparatus configured to process a substrate by immersing the substrate in a processing tub in which a processing liquid is stored (see, for example, Patent Document 1).

In the substrate liquid processing apparatus, an etching processing is performed by moving up and down the substrate while maintaining the substrate in a posture (hereinafter, referred to as "vertical posture") with a plate surface of the substrate being orthogonal to a horizontal direction.

Patent Document 1: Japanese Patent Laid-open Publication No. 2015-056631

In this substrate liquid processing apparatus, however, since the processing liquid adhering to the substrate flows downwards by gravity when the substrate is taken out of the processing tub, the processing may become non-uniform in a vertical direction of the substrate.

SUMMARY

In view of the foregoing, an exemplary embodiment provides a method of reducing non-uniformity of a processing on a substrate.

There is provided a substrate liquid processing apparatus including a placing unit, a liquid processing unit, a transfer unit and a rotating unit. The placing unit is configured to place thereon a substrate carried in from outside. The liquid processing unit is configured to process the substrate by immersing the substrate in a processing liquid with a posture in which a plate surface of the substrate is perpendicular to a horizontal direction. The transfer unit is configured to transfer the substrate between the placing unit and the liquid processing unit. The rotating unit is configured to rotate the substrate, after being subjected to a first processing by the liquid processing unit, around an axis perpendicular to the plate surface of the substrate. The rotating unit is configured to rotate the substrate in a direction different from a direction when the first processing is performed. Further, the transfer unit transfers the substrate, after being subjected to the first processing by the liquid processing unit, to the rotating unit from the liquid processing unit and transfers the substrate, which is rotated by the rotating unit, to the liquid processing unit from the rotating unit. The liquid processing unit performs a second processing by immersing the substrate, which is rotated by the rotating unit, in the processing liquid.

According to the exemplary embodiments, it is possible to reduce the non-uniformity of the processing on the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
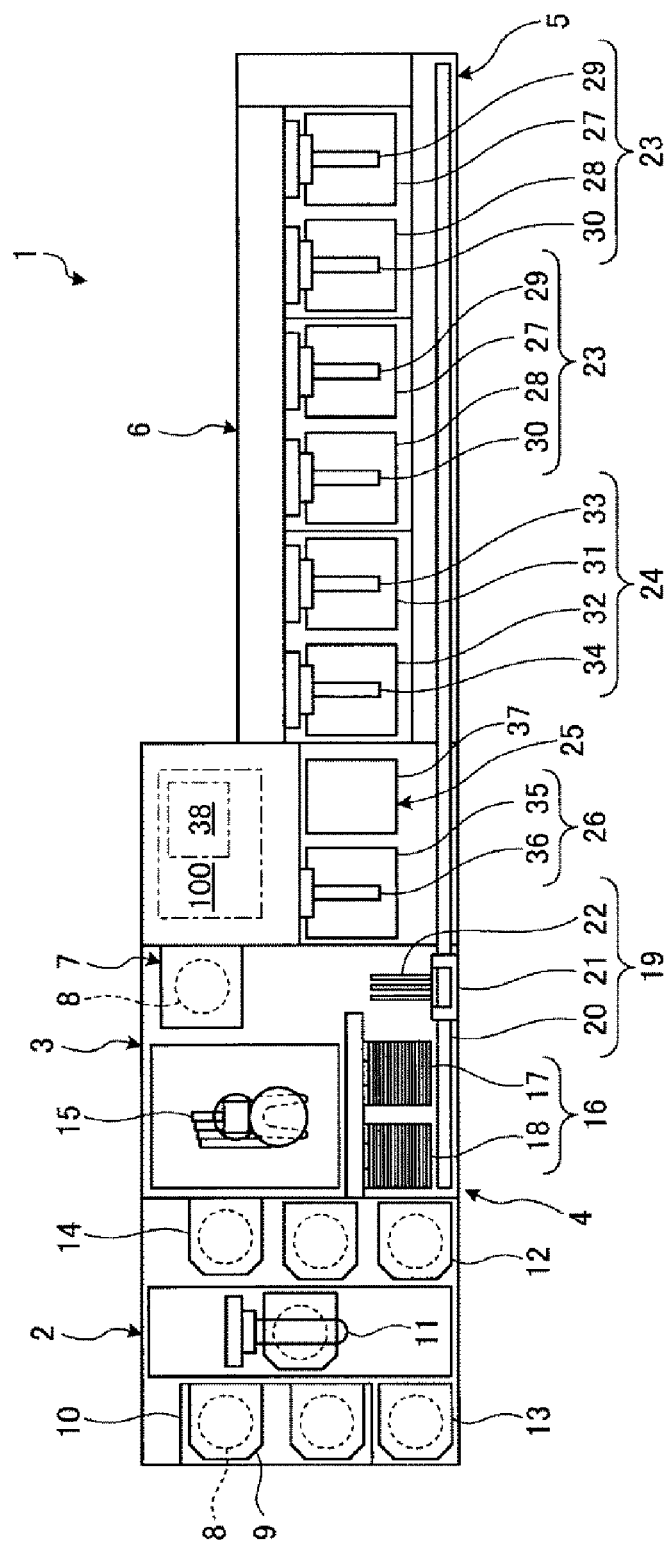
FIG. 1 is a schematic plan view of a substrate liquid processing apparatus.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a substrate liquid processing apparatus and a substrate liquid processing method according to an exemplary embodiment will be described in detail with reference to the accompanying drawings. However, it should be noted that the present disclosure is not limited to the exemplary embodiment.

As depicted in FIG. 1, a substrate liquid processing apparatus 1 includes a carrier carry-in/out unit 2; a lot forming unit 3, a lot placing unit 4, a lot transferring unit 5, a lot processing unit 6, a substrate rotating unit 7 and a control unit 100. FIG. 1 is a schematic plan view of the substrate liquid processing apparatus 1.

The substrate liquid processing apparatus 1 may perform a single processing by dividing it into multiple sub-processings. Here, the exemplary embodiment will be described for an example where a single processing is divided into two sub-processings, but not limited thereto. Further, one sub-processing performed in a first time and the other sub-processing performed in a second time are defined as a first processing and a second processing, respectively, and these processings may be explained while being distinguished from each other. Further, in the following description, a direction perpendicular to a horizontal direction will be referred to as a vertical direction.

The carrier carry-in/out unit 2 is configured to perform a carry-in and a carry-out of a carrier 9 in which a plurality (e.g., 25 sheets) of substrates (silicon wafers) 8 are vertically arranged in a horizontal posture.

The carrier carry-in/out unit 2 is equipped with a carrier stage 10 configured to place multiple carriers 9 thereon; a carrier transfer device 11 configured to transfer the carrier 9; carrier stocks 12 and 13 configured to place therein the carrier 9 temporarily; and a carrier placing table (placing unit) 14 configured to place the carrier 9 thereon.

The carrier carry-in/out unit 2 is configured to transfer the carrier 9, which is carried onto the carrier stage 10 from the outside, to the carrier stock 12 or the carrier placing table 14 by using the carrier transfer device 11. That is, the carrier carry-in/out unit 2 transfers the carrier 9 accommodating therein a plurality of substrates 8 before being processed by the lot processing unit 6 to the carrier stock 12 or the carrier placing table 14.

The carrier stock 12 temporarily places therein the carrier 9 accommodating therein the plurality of substrates 8 before being processed by the lot processing unit 6.

From the carrier 9 which is transferred onto the carrier placing table 14 and accommodates therein the plurality of substrates 8 before being processed by the lot processing unit 6, the plurality of substrates 8 are carried out by a substrate transfer device 15 to be described later.

To the carrier 9 which is placed on the carrier placing table 14 and does not accommodate the substrates 8 therein, a plurality of substrates 8 after being processed by the lot processing unit 6 (that is, a plurality of substrates 8 on which a second processing is performed) is carried into by the substrate transfer device 15.

The carrier carry-in/out unit 2 transfers the carrier 9, which is placed on the carrier placing table 14 and accommodates therein the plurality of the substrates 8 after being processed by the lot processing unit 6, to the carrier stock 13 or the carrier stage 10 by using the carrier transfer device 11.

The carrier stock 13 is configured to temporarily place therein the plurality of substrates 8 after being processed by the lot processing unit 6.

The carrier 9 transferred to the carrier stage 10 is carried outside.

The lot forming unit 3 is equipped with the substrate transfer device 15 configured to transfer a plurality (e.g., 25 sheets) of substrates 8. The lot forming unit 3 is configured to form a lot composed of a multiple number (e.g., 50 sheets) of substrates 8 by performing the transfer of the plurality (e.g., 25 sheets) of substrates 8 through the substrate transfer device 15 twice. The substrate transfer device 15 constitutes a transfer unit.

The lot forming unit 3 forms the lot by transferring a multiple number of substrates 8 (substrates before being subjected to the first processing) into the lot placing unit 4 from the carriers 9 placed on the carrier placing table 14 through the substrate transfer device 15 and placing the multiple number of substrates 8 in the lot placing unit 4.

Further, the lot forming unit 3 forms the lot by transferring a multiple number of substrates 8 (substrates before being subjected to the second processing) into the lot placing unit 4 from the substrate rotating unit 7 through the substrate transfer device 15 and placing the multiple number of substrates 8 in the lot placing unit 4.

A direction of the substrates 8 in the lot formed by combining the multiple number of substrates 8 accommodated in the carriers 9 and a direction of the substrates 8 in the lot formed by combining the multiple number of substrates 8 transferred from the substrate rotating unit 7 are 180° different with respect to an axis perpendicular to the plate surfaces of the substrates 8.

The multiple number of substrates 8 belonging to the single lot are processed by the lot processing unit 6 at the same time.

When forming the lot, the multiple number of substrates 8 may be arranged such that surfaces thereof having patterns formed thereon face each other or such that the surfaces thereof having the patterns formed thereon all face to one direction.

In the lot forming unit 3, a plurality of substrates 8 is transferred by the substrate transfer device 15 into the substrate rotating unit 7 from the lot which is subjected to the first processing and then placed in the lot placing unit 4.

In addition, in the lot forming unit 3, a plurality of substrates 8 is transferred by the substrate transfer device 15 into the carrier 9 from the lot which is subjected to the second processing and then placed in the lot placing unit 4.

The substrate transfer device 15 is configured as a substrate supporting unit configured to support the substrates 8. This substrate transfer device 15 is equipped with two types of substrate supporting unit, that is, a before-processed substrate supporting unit configured to support the substrates 8 before being subjected to the first processing (that is, substrates 8 transferred from the carrier 9); and an after-processed substrate supporting unit configured to support the processed substrates 8 (after being subjected to the first processing or the second processing). Accordingly, particles or the like adhering to the substrates 8 before being subjected to the first processing may be suppressed from adhering to the processed substrates 8.

The substrate transfer device 15 changes a posture of the plurality of substrates 8 from a horizontal posture to a vertical posture and from the vertical posture to the horizontal posture on the way of transfer thereof.

In the lot placing unit 4, the lot transferred between the lot forming unit 3 and the lot processing unit 6 by the lot transfer unit 5 is temporarily placed (stands by) on the lot placing table 16.

The lot placing unit 4 is equipped with a carry-in side lot placing table 17 and a carry-out side lot placing table 18.

The lot before being subjected to the first processing and the lot before being subjected to the second processing are placed on the carry-in side lot placing table 17. That is, the lot composed of the multiple number of substrates 8 transferred from the carriers 9 by the substrate transfer device 15 and the lot composed of the multiple number of substrates 8 transferred from the substrate rotating unit 7 by the substrate transfer device 15 are placed on the carry-in side lot placing table 17.

The lot after being subjected to the first processing and the lot after being subjected to the second processing are placed on the carry-out side lot placing table 18. That is, the lot composed of the substrates 8 transferred by a lot transfer device 19 to be described later is placed on the carry-out side lot placing table 18.

In the carry-in side lot placing table 17 and the carry-out side lot placing table 18, the substrates 8 corresponding to the single lot are arranged in a forward-backward direction with the vertical posture.

The lot transfer unit 5 is configured to transfer the lot between the lot placing unit 4 and the lot processing unit 6 or within the lot processing unit 6.

The lot transfer unit 5 is equipped with the lot transfer device 19 configured to transfer the lot. The lot transfer device 19 has a rail 20 extended along the lot placing unit 4 and the lot processing unit 6; and a moving body 21 configured to be moved along the rail 20 while holding the lot. The lot transfer unit 5 constitutes the transfer unit.

The moving body 21 is provided with a substrate holding body 22 for holding the lot composed of the multiple number of substrates 8 arranged in the forward-backward direction with the vertical posture.

The lot transfer unit 5 receives the lot placed on the carry-in side lot placing table 17 with the substrate holding body 22 of the lot transfer device 19 and delivers the received lot to the lot processing unit 6.

Further, the lot transfer unit 5 receives the lot processed by the lot processing unit 6 with the substrate holding body 22 of the lot transfer device 19 and delivers the received lot to the carry-out side lot placing table 18.

Further, the lot transfer unit 5 also performs the transfer of the lot within the lot processing unit 6 with the lot transfer device 19.

The lot processing unit 6 is configured to perform a processing such as etching, cleaning or drying on the lot formed of the substrates 8 arranged in the forward-backward direction with the vertical posture. The lot processing unit 6 performs the processing by dividing it into the first processing and the second processing, i.e., two times.

The lot processing unit 6 includes two etching apparatuses 23 configured to perform an etching processing on the lot; a cleaning apparatus 24 configured to perform a cleaning processing on the lot; a substrate holding body cleaning apparatus 25 configured to perform a cleaning processing on the substrate holding body 22; and a drying apparatus (drying unit) 26 configured to perform a drying processing on the lot.

Each etching apparatus 23 includes a processing tub (liquid processing tub) 27 for etching, a processing tub 28 for rinsing and substrate elevating devices 29 and 30.

The processing tub 27 for etching stores therein a processing liquid for etching (e.g., a phosphoric acid aqueous solution). The processing tub 28 for rinsing stores therein a processing liquid for rinsing (e.g., pure water).

The multiple number of substrates 8 constituting the single lot are held on the substrate elevating device 29 (30) while being arranged in the forward-backward direction with the vertical posture.

The substrate elevating device 29 of the etching apparatus 23 receives the lot from the substrate holding body 22 of the lot transfer device 19, and the received lot is lowered by the substrate elevating device 29. Accordingly, the lot is immersed in the processing liquid for etching in the processing tub 27, so that an etching processing is performed on the lot.

Thereafter, the etching apparatus 23 takes the lot out of the processing tub 27 by raising the substrate elevating device 29 and transfers the lot to the substrate holding body 22 of the lot transfer device 19 from the substrate elevating device 29.

Then, the lot is received by the substrate elevating device 30 from the substrate holding body 22 of the lot transfer device 19, and the received lot is lowered by the substrate elevating device 30. Accordingly, the lot is immersed in the processing liquid for rinsing in the processing tub 28, so that a rinsing processing is performed on the lot.

Thereafter, the etching apparatus 23 takes the lot out of the processing tub 28 by moving up the substrate elevating device 30 and delivers the lot from the substrate elevating device 30 to the substrate holding body 22 of the lot transfer device 19.

Figure 2:
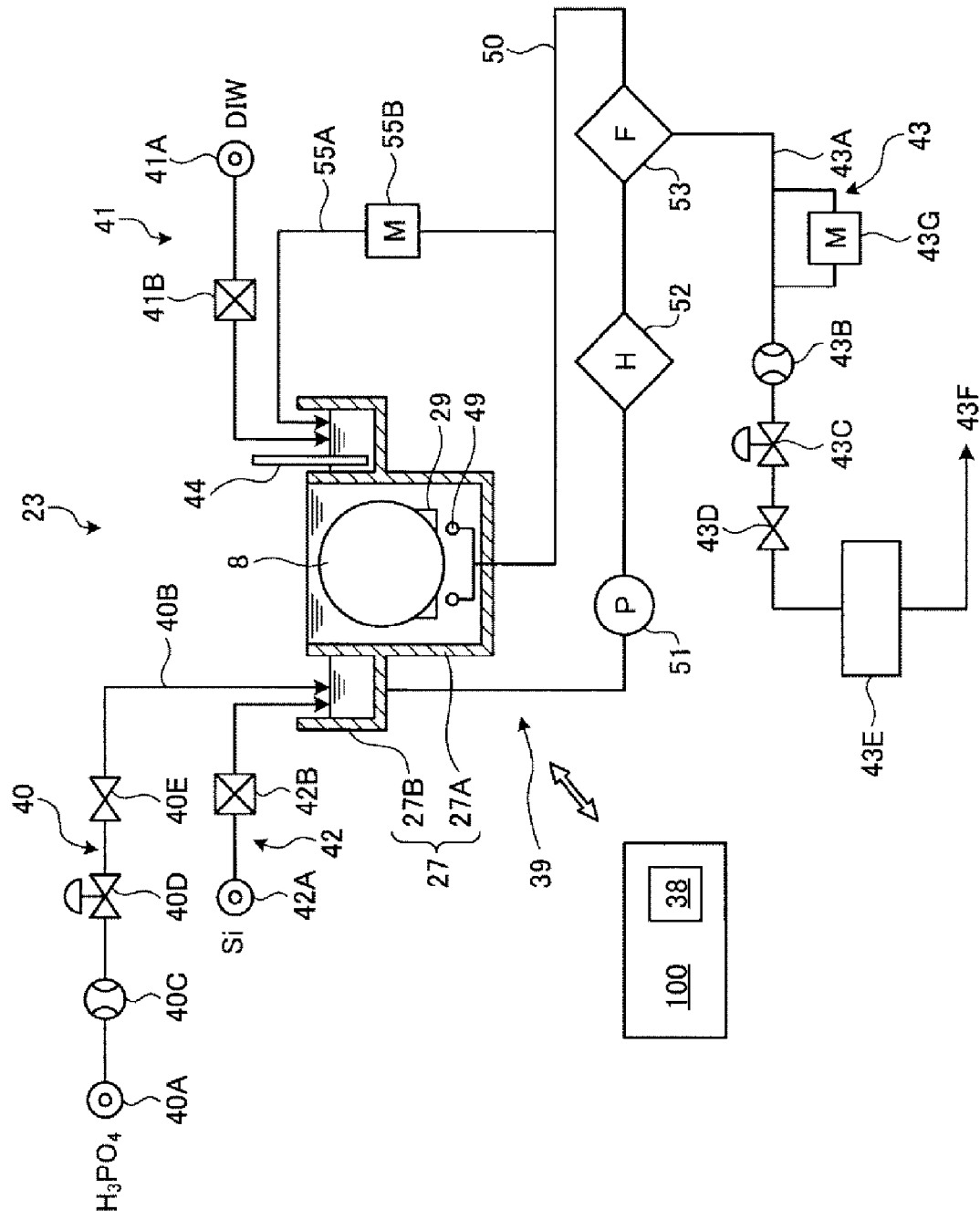
FIG. 2 is a schematic block diagram illustrating a configuration of an etching apparatus.

Here, the etching apparatus 23 will be explained in detail with reference to FIG. 2. FIG. 2 is a schematic block diagram illustrating a configuration of the etching apparatus 23.

The etching apparatus 23 includes the processing tub 27, a phosphoric acid aqueous solution supply unit 40, a pure water supply unit 41, a silicon supply unit 42 and a phosphoric acid aqueous solution drain unit 43.

In the processing tub 27, the lot (substrates 8) is liquid-processed (etched) by using an aqueous solution (phosphoric acid aqueous solution) of a chemical (phosphoric acid) having a preset concentration as a processing liquid (etching liquid).

The processing tub 27 includes an inner tub 27A having an open top; and an outer tub 27B which has an open top and is provided around an upper portion of the inner tub 27A. The phosphoric acid aqueous solution overflowing from the inner tub 27A is introduced into the outer tub 27B.

One end of a circulation line 50 is connected to a bottom portion of the outer tub 27B. The other end of the circulation line 50 is connected to a processing liquid supply nozzle (discharging unit) 49 provided within the inner tub 27A. The circulation line 50 is provided with a pump 51, a heater 52 and a filter 53 in sequence from the upstream side. By operating the pump 51, there is generated a circulation flow of the phosphoric acid aqueous solution which is sent from the outer tub 27B into the inner tub 27A via the circulation line 50 and the processing liquid supply nozzle 49 and then flown back into the outer tub 27B.

The processing tub 27, the circulation line 50, the devices 51, 52 and 53 within the circulation line 50, and so forth constitute a liquid processing unit 39. Further, the processing tub 27 and the circulation line 50 constitute a circulation system.

The lot is immersed in the processing tub 27 by the substrate elevating device 29. The substrate elevating device 29 is configured to hold a multiple number of substrates 8 while arranging the substrates 8 in the vertical posture with a distance maintained therebetween in the horizontal direction. Further, the substrate elevating device 29 is configured to move up and down in this state.

Figure 3:
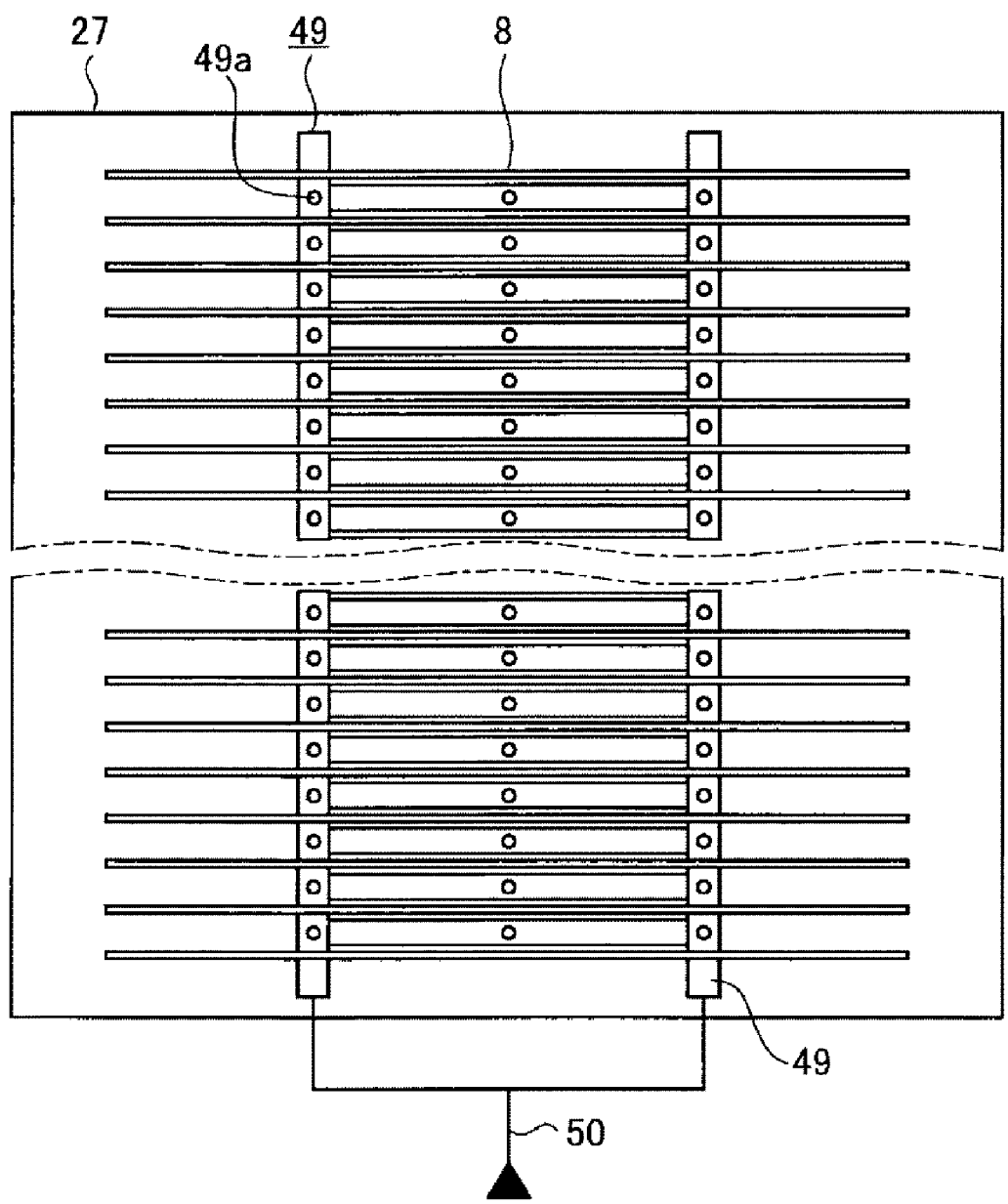
FIG. 3 is a schematic plan view of a processing tub (inner tub)

As shown in FIG. 3, the processing liquid supply nozzle 49 is implemented by a cylindrical body which is extended in an arrangement direction of the multiple number of substrates 8 and has a peripheral surface provided with multiple discharge openings 49a. FIG. 3 is a schematic plan view of the processing tub 27 (inner tub 27A).

The processing liquid supply nozzle 49 is provided at a bottom portion side of the processing tub 27 and discharges the processing liquid from the discharge openings 49a toward the lot held by the substrate elevating device 29. Accordingly, an upflow of the phosphoric acid aqueous solution flowing upwards from a lower portion of the processing tub 27 is generated within the processing tub 27. In the processing tub 27, the processing liquid discharged from the discharge openings 49a flow along the plate surfaces of the substrates 8. Therefore, a flow velocity of the processing liquid flowing on a lower portion of each substrate 8 is higher than a flow velocity of the processing liquid flowing on an upper portion of each substrate 8.

The phosphoric acid aqueous solution supply unit 40 supplies the phosphoric acid aqueous solution having a preset concentration to a certain part within the circulation system composed of the processing tub 27 and the circulation line 50, that is, within the liquid processing unit 39. Desirably, the phosphoric acid aqueous solution supply unit 40 supplies the phosphoric acid aqueous solution of the preset concentration into the outer tub 27B, as shown in the drawing.

The phosphoric acid aqueous solution supply unit 40 includes a phosphoric acid aqueous solution supply source 40A implemented by a tank storing therein the phosphoric acid aqueous solution; a phosphoric acid aqueous solution supply line 40B connecting the phosphoric acid aqueous solution supply source 40A and the outer tub 27B; and a flowmeter 40C, a flow rate control valve 40D and an opening/closing valve 40E provided at the phosphoric acid aqueous solution supply line 40B in sequence from the upstream side. The phosphoric acid aqueous solution supply unit 40 supplies the phosphoric acid aqueous solution into the outer tub 27B at a controlled flow rate via the flowmeter 40C and the flow rate control valve 40D.

The pure water supply unit 41 is configured to supply pure water into the liquid processing unit 39 to supplement moisture evaporated as the phosphoric acid aqueous solution is heated. The pure water supply unit 41 includes a pure water supply source 41A configured to supply the pure water of a preset temperature. The pure water supply source 41A is connected to the outer tub 27B via a flow rate controller 41B. The flow rate controller 41B may be implemented by an opening/closing valve, a flow rate control valve, a flowmeter, or the like.

The silicon supply unit 42 is configured to supply a silicon solution to the liquid processing unit 39. The silicon supply unit 42 includes a silicon supply source 42 implemented by a tank storing the silicon solution, e.g., a liquid in which a colloidal silicon is dispersed; and a flow rate controller 42B. The flow rate controller 42B may be implemented by an opening/closing valve, a flow rate control valve, a flowmeter, or the like.

The phosphoric acid aqueous solution drain unit 43 is configured to drain the phosphoric acid aqueous solution within the circulation system composed of the processing tub 27 and the circulation line 50, that is, within the liquid processing unit 39. The phosphoric acid aqueous solution drain unit 43 includes a drain line 43A branched from the circulation line 50; and a flowmeter 43B, a flow rate control valve 43C, an opening/closing valve 43D and a cooling tank 43E provided at the drain line 43A in sequence from the upstream side. The phosphoric acid aqueous solution drain unit 43 drains the phosphoric acid aqueous solution at a controlled flow rate via the flowmeter 43B and the flow rate control valve 43C.

The cooling tank 43E temporarily stores the phosphoric acid aqueous solution flown from the drain line 43A while cooling the phosphoric acid aqueous solution. The phosphoric acid aqueous solution (see a reference numeral 43F) flown out from the cooling tank 43E may be wasted into a factory waste liquid system (not shown) or may be reused by being sent to the phosphoric acid aqueous solution supply source 40A after silicon contained in the phosphoric acid aqueous solution is removed by a recycling apparatus (not shown).

The drain line 43A is connected to the circulation line 50 (a position of a filter drain in the drawing), but not limited thereto. For example, the drain line 43A may be connected to another portion within the circulation line, e.g., a bottom portion of the inner tub 27A.

The drain line 43A is equipped with a silicon concentration meter 43G configured to measure a silicon concentration in the phosphoric acid aqueous solution. Further, a branch line 55A branched from the circulation line 50 and connected to the outer tub 27B is provided with a phosphoric acid concentration meter 55B configured to measure a phosphoric acid concentration in the phosphoric acid aqueous solution. The outer tub 27B is provided with a liquid level meter 44 configured to detect a liquid level within the outer tub 27B.

Referring back to FIG. 1, the cleaning apparatus 24 includes a processing tub 31 for cleaning, a processing tub 32 for rinsing and substrate elevating devices 33 and 34.

The processing tub 31 for cleaning stores therein a processing liquid for cleaning (SC-1 or the like). The processing tub 32 for rinsing stores therein a processing liquid for rinsing (pure water or the like).

The substrates 8 corresponding to the single lot are held by each of the substrate elevating devices 33 and 34 while being arranged in the forward-backward direction with the vertical posture.

The cleaning apparatus 24 has the same configuration as the etching apparatus 23. Thus, a detailed description thereof will be omitted here. In the processing tub 31 for cleaning of the cleaning apparatus 24, there is generated an upflow of the processing liquid flowing upwards from a bottom portion of the processing tub 31, as in the processing tub 27 for etching of the etching apparatus 23.

The drying apparatus 26 is equipped with a processing tub 35 and a substrate elevating device 36 configured to be moved up and down with respect to the processing tub 35.

A processing gas for drying (IPA (isopropyl alcohol) or the like) is supplied into the processing tub 35. The substrates 8 corresponding to the single lot are held by the substrate elevating devices 36 while being arranged in the forward-backward direction with the vertical posture.

The drying apparatus 26 receives the lot from the substrate holding body 22 of the lot transfer device 19 with the substrate elevating device 36, and the received lot is lowered into the processing tub 35 by the substrate elevating device 36. The lot is dried by the processing gas for drying which is supplied into the processing tub 35. The drying apparatus 26 raises the lot by the substrate elevating device 36 and delivers the dried lot to the substrate holding body 22 of the lot transfer device 19 from the substrate elevating device 36.

The substrate holding body cleaning apparatus 25 includes a processing tub 37 and is configured to supply a processing liquid for cleaning and a drying gas into the processing tub 37. By supplying the drying gas after supplying the processing liquid for cleaning to the substrate holding body 22 of the lot transfer device 19, a cleaning processing on the substrate holding body 22 is performed.

Figure 4:
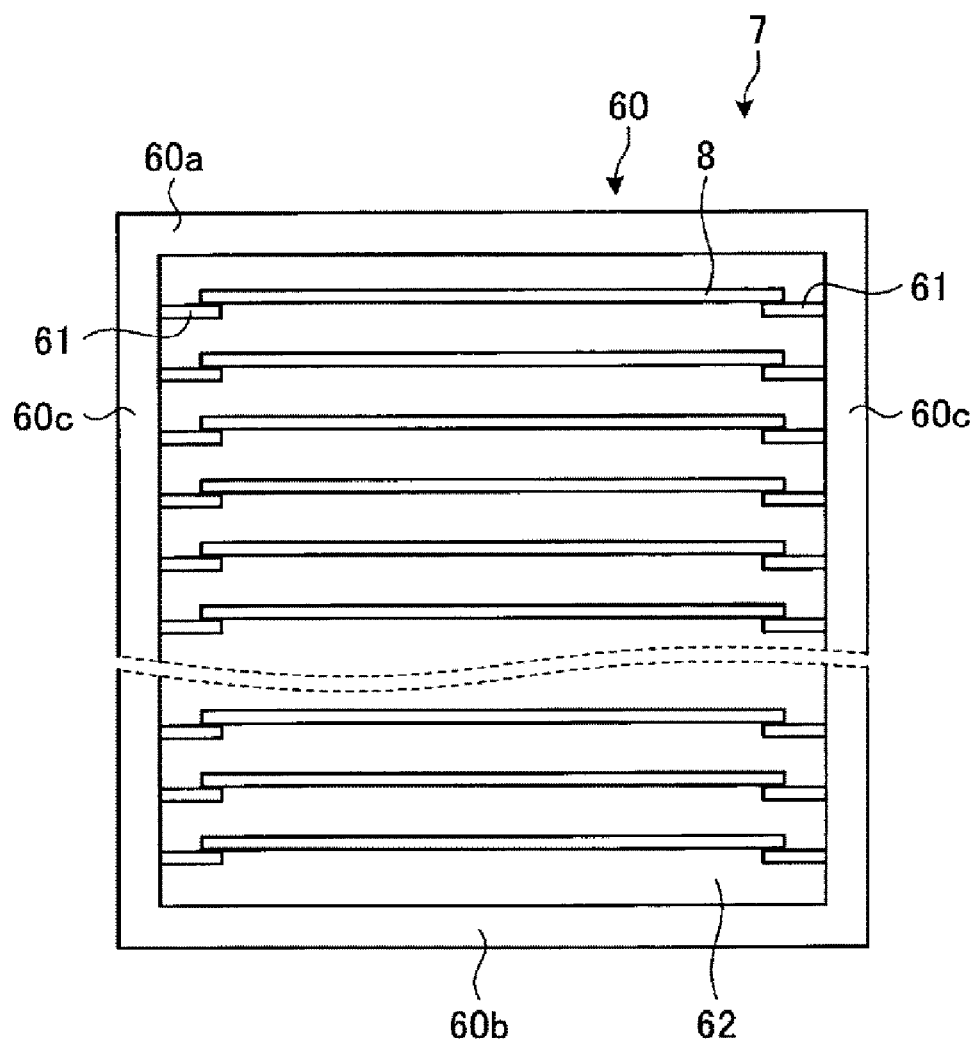
FIG. 4 is a schematic side view of a substrate rotating unit.

The substrate rotating unit 7 is placed within the lot forming unit 3. The substrate rotating unit 7 includes, as illustrated in FIG. 4, a case 60 and supporting members 61. FIG. 4 is a schematic side view of the substrate rotating unit 7. The substrate rotating unit 7 is placed within the lot forming unit 3. By way of example, the substrate rotating unit 7 is placed in an empty space within a lot forming unit of a conventional substrate liquid processing apparatus. Accordingly, the substrate rotating unit 7 can be provided without causing a scale-up of the substrate liquid processing apparatus 1.

The case 60 has a top surface portion 60a, a bottom surface portion 60b and side surface portions 60c. The case 60 has a pair of side surface portions 60c facing each other. That is, the case 60 is formed to have a rectangular cube shape having openings 62 at a pair of side surfaces thereof. The case 60 accommodates the multiple (e.g., 25 sheets) substrates 8.

The supporting members 61 are provided at inner walls of the side surface portions 60c. The case 60 supports a bottom surface of each substrate 8 by a pair of supporting members 61 provided at the respective side surface portions 60c to face each other. The pair of supporting members 61 is provided to be located at the same positions in the vertical direction. Multiple (e.g., 25) pairs of supporting members 61 are provided to accommodate the substrates 8 carried in by the substrate transfer device 15. The pairs of supporting members 61 are arranged at a regular interval in the vertical direction.

The supporting members 61 are provided so as not to be in contact with the substrate transfer device 15 when the substrates 8 are carried into or out of the case 60 by the substrate transfer device 15.

In the substrate rotating unit 7, the substrates 8 are horizontally held by the supporting members 61. The substrate rotating unit 7 rotates around an axis perpendicular to the plate surfaces of the substrates 8, that is, a vertical axis by a driving unit (not shown) such as a motor or an encoder. The substrate rotating unit 7 rotates at a preset low rotation speed. The preset low rotation speed is set in advance such that positions of the substrates 8 are not deviated from the supporting members 61 while being rotated.

As stated above, in the substrate rotating unit 7, as the case 60 accommodating the substrates 8 therein is rotated, the substrates 8 are rotated along with the case 60.

The substrates 8 after being subjected to the first processing is carried into the substrate rotating unit 7 through the opening 62 by the substrate transfer device 15, and each of the substrates 8 is held by each corresponding pair of the supporting members 61. The substrate rotating unit 7 is rotated by 180° in a state that each substrate 8 is supported by each corresponding pair of the supporting members 61. The rotated substrates 8 are then carried out by the substrate transfer device 15 through the opening 62 at the opposite side from the opening 62 through which the substrates 8 are carried in. In the substrate rotating unit 7, the openings 62 are formed such that the substrates 8 are carried in and out from the same direction.

By rotating the plurality of substrates 8 through the substrate rotating unit 7, a direction of the plurality of substrates 8 carried out of the substrate rotating unit 7 by the substrate transfer device 15 is 180° different from a direction of the plurality of substrates 8 carried into the substrate rotating unit 7 by the substrate transfer device 15. That is, the substrate rotating unit 7 rotates the plurality of substrates 8 to a direction which is 180° different from a direction when the first processing is performed.

The control unit 100 controls operations of individual components (the carrier carry-in/out unit 2, the lot forming unit 3, the lot placing unit 4, the lot transfer unit 5, the lot processing unit 6 and the substrate rotating unit 7) of the substrate liquid processing apparatus 1. The control unit 100 controls the operations of the individual components of the substrate liquid processing apparatus 1 based on signals from a switch or the like and enables the single processing to be performed by being divided into multiple sub-processings. Further, the control unit 100 may allow the single processing to be performed at a single time by controlling the operations of the individual components of the substrate liquid processing apparatus 1 based on the signals from the switch or the like.

The control unit 100 may be implemented by, by way of non-limiting example, a computer and has a computer-readable recording medium 38. The recording medium 38 stores therein a program for controlling various types of processings performed in the substrate liquid processing apparatus 1.

The control unit 100 controls the operation of the substrate liquid processing apparatus 1 by reading and executing the program stored in the recording medium 38. The program is stored in the compute-readable recording medium 38 and may be installed to the recording medium 38 of the control unit 100 from another recording medium.

The computer-readable recording medium 38 may be implemented by, by way of example, a hard disk HD, a flexible disk FD, a compact disk CD, a magnet optical disk MO, a memory card, or the like.

Figure 5:
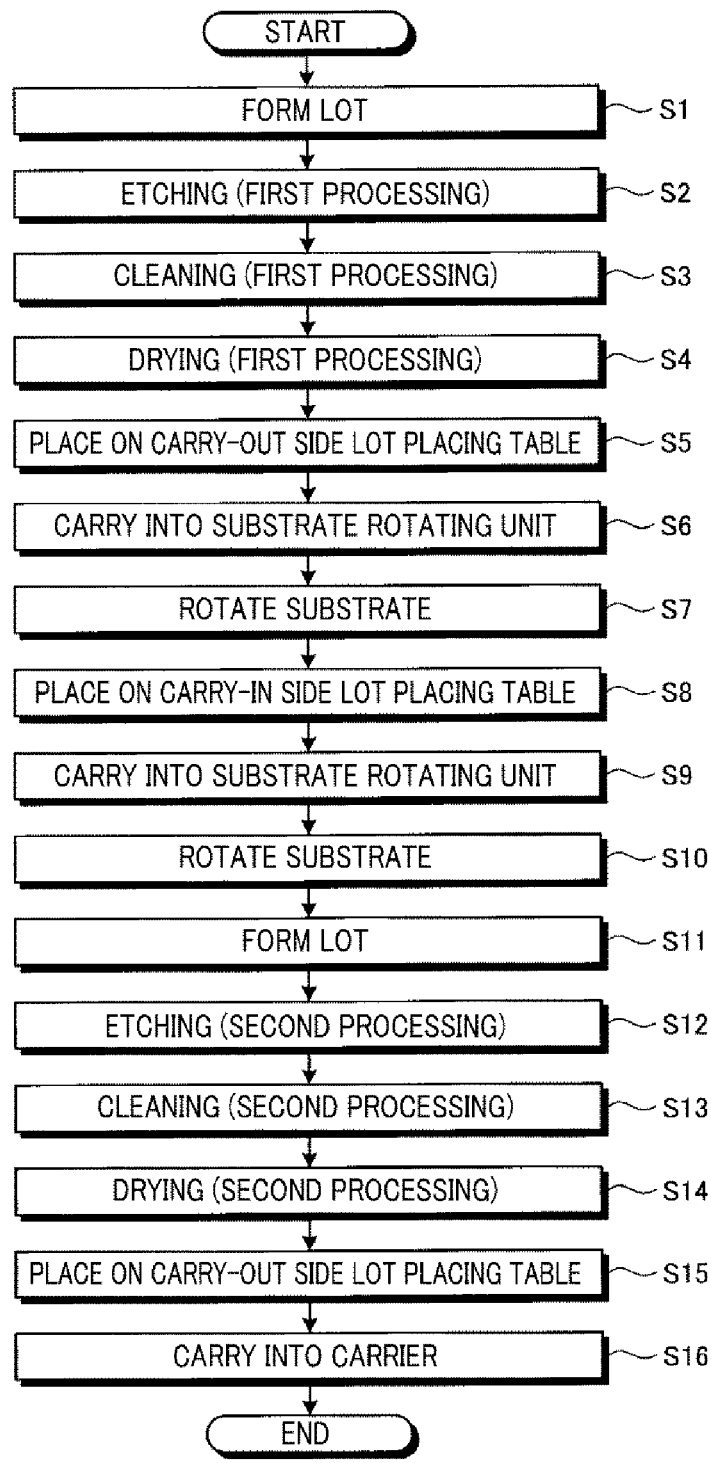
FIG. 5 is a flowchart for describing a processing sequence of the substrate liquid processing apparatus.

Now, a processing sequence of the substrate liquid processing apparatus 1 will be explained with reference to a flowchart of FIG. 5. FIG. 5 is the flowchart for describing the processing sequence of the substrate liquid processing apparatus 1.

The substrate liquid processing apparatus 1 takes out the substrates 8 from each of two carriers 9 by the substrate transfer device 15, and forms the lot (e.g., 50 sheets of substrates) by combining the multiple (e.g., 25 sheets) substrates 8 accommodated in each of the carriers 9 (process S1).

To elaborate, the substrate transfer device 15 takes out the substrates 8 from the carrier 9 placed on the carrier placing table 14 and changes the posture of the taken substrates 8 from the horizontal posture to the vertical posture. Then, the substrate transfer device 15 places the substrates 8 on the carry-in side lot placing table 17.

Then, the substrate transfer device 15 takes out the substrates 8 from another carrier 9 placed on the carrier placing table 14 and places the plurality of substrates 8 on the carry-in side lot placing table 17. At this time, the substrate transfer device 15 places the substrates 8 placed at this time between the substrates 8 previously placed thereon. As a result, the lot is formed.

The substrate liquid processing apparatus 1 performs the etching of the first processing on the lot formed on the carry-in side lot placing table 17 (process S2).

To be specific, the substrate holding body 22 of the lot transfer device 19 receives the lot formed on the carry-in side lot placing table 17, and the moving body 21 of the lot transfer device 19 transfers the received lot to the front of the processing tub 27 of the etching apparatus 23. Then, the substrate elevating device 29 receives the transferred lot, and, then, the etching processing of the first processing is performed on the lot.

The etching of the first processing is performed under a preset processing condition. The preset processing condition is set in advance and includes an immersion time in the processing tub 27, a temperature of the processing liquid, a concentration of the processing liquid, a flow rate of the processing liquid, and so forth. Further, the immersion time is set to a half of a time length which is set in case of completing the etching processing by the single processing. The substrates 8 belonging to the lot is immersed in the processing tub 27 while being held in the vertical posture.

Upon the completion of the etching processing, the substrate holding body 22 receives the lot, and the moving body 21 transfers the received lot to the front of the processing tub 28. Then, the substrate elevating device 30 receives the transferred lot, and the rinsing processing of the first processing is performed on the lot.

The rinsing processing is performed by immersing the lot, on which the etching processing is performed, in the processing tub 28. Further, an immersion time in the processing tub 28 may be set to be shorter than the time length which is set in case of completing the etching processing by the single processing.

The substrate liquid processing apparatus 1 performs a cleaning of the first processing on the lot on which the etching of the first processing is performed (process S3).

To elaborate, upon the completion of the rinsing processing, the substrate holding body 22 receives the lot, and the moving body 21 transfers the received lot to the front of the processing tub 31 of the cleaning apparatus 24. Then, in the cleaning apparatus 24, the cleaning processing of the first processing and the rinsing processing of the first processing are performed.

Further, an immersion time in the processing tub 31 by the cleaning processing or an immersion time in the processing tub 32 by the rinsing processing may be set to be shorter than the time length which is set in case of completing the etching processing by the single processing.

The substrate liquid processing apparatus 1 performs the drying of the first processing on the lot on which the cleaning of the first processing is performed (process S4).

To elaborate, upon the completion of the rinsing processing, the substrate holding body 22 receives the lot, and the moving body 21 transfers the received lot to the front of the drying apparatus 26. Then, in the drying apparatus 26, the drying of the first processing is performed.

The substrate liquid processing apparatus 1 places the lot after being subjected to the drying processing on the carry-out side lot placing table 18 (process S5).

Further, during a time period until the lot is placed on the carry-out side lot placing table 18 after the multiple number of substrates 8 are taken out of the carriers 9 by the substrate transfer device 15, each of the substrates 8 is not rotated around an axis perpendicular to the plate surface of the substrate 8.

The substrate liquid processing apparatus 1 takes out the substrates 8 from the lot placed on the carry-out side lot placing table 18 by the substrate transfer device 15, and then, carries the taken substrates 8 into the substrate rotating unit 7 (process S6). The substrate transfer device 15 changes the posture of the taken substrates 8 from the vertical posture to the horizontal posture and carries these substrates 8 into the substrate rotating unit 7.

Furthermore, when the plurality of substrates 8 are taken out by the substrate transfer device 15, while the plurality of substrates 8 are being transferred by the substrate transfer device 15 and when the plurality of substrates 8 are carried into the substrate rotating unit 7, each substrate 8 is not rotated around the axis perpendicular to the plate surface of the substrate 8.

The substrate liquid processing apparatus 1 rotates the substrate rotating unit 7 (process S7).

Figure 6A:
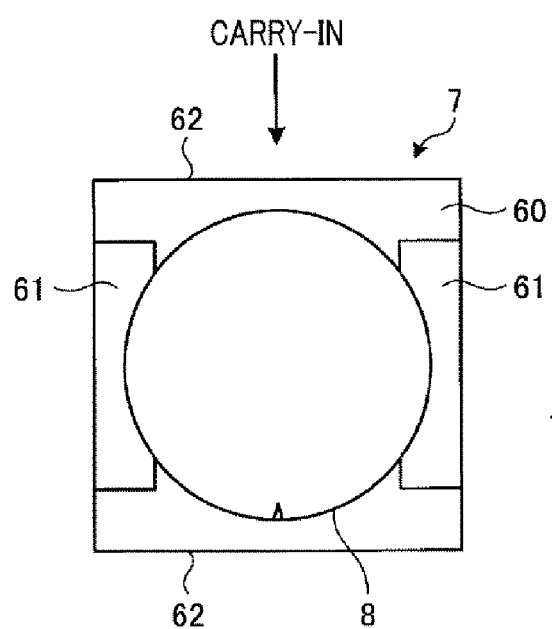
FIG. 6A to FIG. 6C are schematic diagrams for describing a rotation of a plurality of substrates by the substrate rotating unit.
Figure 6B:
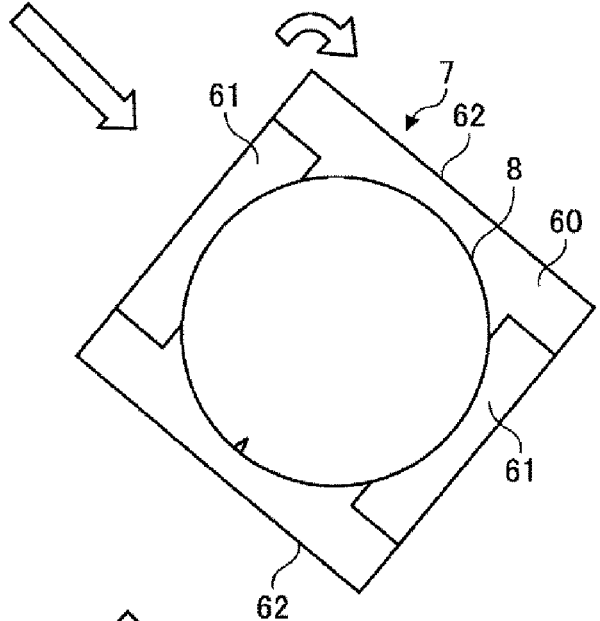
Figure 6C:
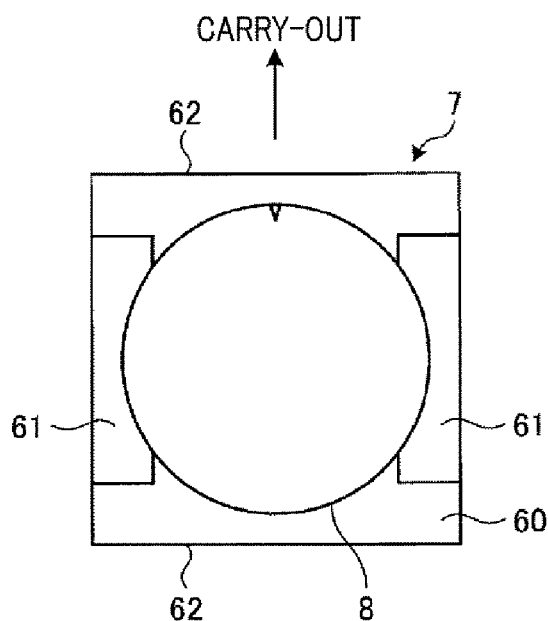

To elaborate, the substrate liquid processing apparatus 1 rotates the case 60, which is in a state (FIG. 6A) where it accommodates the plurality of substrates 8 carried through the opening 62 by the substrate transfer device 15, around the axis perpendicular to the plate surfaces of the substrates 8 (FIG. 6B), so that the substrates 8 are turned into a state where they are rotated by 180° from the state when they are carried in by the substrate transfer device 15 (FIG. 6C). FIG. 6A to FIG. 6C are schematic diagrams for describing the rotation of the plurality of substrates 8 by the substrate rotating unit 7. In FIG. 6A to FIG. 6C, the substrates 8 are illustrated to have a notch for the purpose of explanation, and a carry-in direction and a carry-out direction are indicate by arrows.

In the substrate liquid processing apparatus 1, the plurality of substrates 8 rotated by the substrate rotating unit 7 are taken out of the substrate rotating unit 7 by the substrate transfer device 15 and placed on the carry-in side lot placing table 17 (process S8). The substrate transfer device 15 changes the posture of the plurality of substrates 8 from the horizontal posture to the vertical posture and places the plurality of substrates 8 on the carry-in side lot placing table 17. Further, when taking out the plurality of substrates 8 from the substrate rotating unit 7, the substrate transfer device 15 carries out the plurality of substrates 8 from the same direction as the direction from which the plurality of substrates 8 are carried in.

The substrate liquid processing apparatus 1 carries out the rest of the substrates 8 placed on the carry-out side lot placing table 18 by the substrate transfer device 15 and carries these substrates into the substrate rotating unit 7 (process S9). The substrate transfer device 15 changes the posture of the plurality of substrate 8 from the vertical posture to the horizontal posture and transfers the plurality of substrates 8 into the substrate rotating unit 7.

The substrate liquid processing apparatus 1 rotates the substrate rotating unit 7 (process S10). A specific method of this rotation is the same as the above-described method (process S7).

In the substrate liquid processing apparatus 1, the plurality of substrates 8 rotated by the substrate rotating unit 7 are carried out of the substrate rotating unit 7 by the substrate transfer device 15 and placed on the carry-in side lot placing table 17, so that the lot is formed (process S11). The substrate transfer device 15 changes the posture of the plurality of substrate 8 from the horizontal posture to the vertical posture and places the plurality of substrates 8 on the carry-in side lot placing table 17, so that the lot is formed. The method of placing the substrates 8, that is, the lot forming method is the same as the above-described method (process S1).

Here, each substrate 8 belonging to the lot formed here is in a state where it is rotated by 180° around the axis perpendicular to the plate surface of the substrate 8, that is, in a state where the vertical direction is inverted with respect to each substrate 8 belonging to the lot before being subjected to the first processing.

Furthermore, when the plurality of substrates 8 are taken out of the substrate rotating unit 7 by the substrate transfer device 15, while the plurality of substrates 8 are being transferred by the substrate transfer device 15 and when the plurality of substrates 8 are placed on the carry-in side lot placing table 17, each substrate 8 is not rotated around the axis perpendicular to the plate surface of the substrate 8.

The substrate liquid processing apparatus 1 performs an etching of the second processing on the lot formed on the carry-in side lot placing table 17 (process S12).

To elaborate, the substrate holding body 22 receives the lot formed on the carry-in side lot placing table 17, and the moving body 21 transfers the received lot to the front of the processing tub 27 of the etching apparatus 23. Then, the substrate elevating device 29 receives the transferred lot, and the etching processing of the second processing is performed.

The etching processing of the second processing is performed under the same preset processing condition as that of the etching processing of the first processing. The multiple number of substrates 8 constituting the lot are immersed in the processing tub 27 while keeping the vertical posture. Further, each substrate 8 is immersed in the processing tub 27 in a state that the substrate 8 is inverted in the vertical direction with respect to the state when the first processing is performed.

Further, the etching processing of the second processing is performed in the same processing apparatus as the etching apparatus 23 used to perform the etching processing of the first processing.

Further, during a time period until the substrates 8 are immersed in the processing tub 27 after being placed on the carry-in side lot placing table 17, each substrate 8 is not rotated around the axis perpendicular to the plate surface thereof.

Upon the completion of the etching processing, the lot is received by the substrate holding body 22, and the received lot is transferred to the front of the processing tub 28 by the moving body 21. Then, the substrate elevating device 30 receives the transferred lot, and the rinsing processing of the second processing is performed.

The substrate liquid processing apparatus 1 performs the cleaning of the second processing on the lot on which the etching of the second processing is performed (process S13). The cleaning of the second processing is performed in the same manner as the cleaning (process S3) of the first processing.

The substrate liquid processing apparatus 1 performs the drying of the second processing on the lot on which the cleaning of the second processing is performed (process S14). The drying of the second processing is performed in the same manner as the drying (process S4) of the first processing.

The substrate liquid processing apparatus 1 then places the lot after being subjected to the drying processing on the carry-out side lot placing table 18 (process S15).

Then, the substrate liquid processing apparatus 1 takes out the substrates 8 from the lot placed on the carry-out side lot placing table 18 by the substrate transfer device 15, and the substrates 8 are carried into the carrier 9 placed on the carrier placing table 14 (process S16). Further, by replacing the carrier 9, the multiple number of substrates 8 are loaded into the two carriers 9.

The carrier 9 accommodating therein the processed substrates 8 as stated above is transferred to the carrier stock 13 or the carrier stage 10 by using the carrier transfer device 11, and the carrier 9 transferred onto the carrier stage 10 is then carried out of the apparatus.

Now, effects of the exemplary embodiment will be explained.

If the etching processing is performed by immersing each substrate with the vertical posture in the processing tub for etching, the processing liquid adhering to each substrate flows downwards by gravity when the lot is taken out of the processing tub and transferred into the processing tub for rinsing. Therefore, a liquid film may become non-uniform on the substrate in the vertical direction thereof, which may results in non-uniformity of the processing.

Furthermore, if the processing liquid is discharged along the plate surface of the substrate in the processing tub and if, for example, the processing liquid is discharged upwards from a lower portion of the processing tub, a flow velocity of the processing liquid at a lower portion of the substrate may be higher than a flow velocity of the processing liquid at an upper portion thereof, which may result in non-uniformity of the processing in the vertical direction of the substrate.

According to the present exemplary embodiment, however, the plurality of substrate 8 are rotated around the axis perpendicular to the plate surfaces of the substrates 8 by the substrate rotating unit 7 after the first processing, and the etching processing of the second processing is performed on each substrate 8 by immersing the substrate 8 in the processing tub 27 in a direction different from the direction set for the etching processing of the first processing. Accordingly, the non-uniformity of the processing on the substrates 8 can be reduced.

By rotating the substrates 8 at an angle of 180° with respect to the axis perpendicular to the plate surfaces of the substrates 8 through the substrate rotating unit 7, non-uniformity of the processing upon the substrates 8 can be reduced.

Furthermore, by performing the above processings just a small number of times, the non-uniformity of the processing upon the substrates 8 can be reduced, and an increase of a total processing time can be suppressed.

The plurality of substrates 8 are accommodated in the case 60, and by rotating the case 60 in the state that the plurality of substrates 8 are accommodated therein, the plurality of substrates 8 are rotated. Furthermore, the openings 62 are formed at the case 60 to allow the plurality of substrates 8 to be carried into and carried out of the case 60 from the same direction by the substrate transfer device 15. With this configuration, the plurality of substrates 8 can be rotated just by providing a simple rotating device to the conventional substrate liquid processing apparatus, which leads to a reduction of the non-uniformity of the processing upon the substrates 8.

The plurality of substrates 8 are transferred into the substrate rotating unit 7 after being dried by the drying apparatus 26. Thus, the substrate rotating unit 7 and the substrate transfer device 15 can be suppressed from getting wet.

The first processing and the second processing are performed under the same processing condition. Accordingly, a discrepancy between the first processing and the second processing can be suppressed, so that the non-uniformity of the processing upon the substrates 8 can be reduced.

As for the processing tub 27, even if the etching processings are performed under the same condition, there may be generated a discrepancy in the processings by the members constituting each processing tub 27. In view of this problem, according to the present exemplary embodiment, the first processing and the second processing are performed on the same substrates 8 in the same processing tub 27. Thus, the discrepancy between the first processing and the second processing can be suppressed, so that the non-uniformity of the processing upon the substrates 8 can be reduced.

Now, modification examples of the present exemplary embodiment will be discussed.

Figure 7:
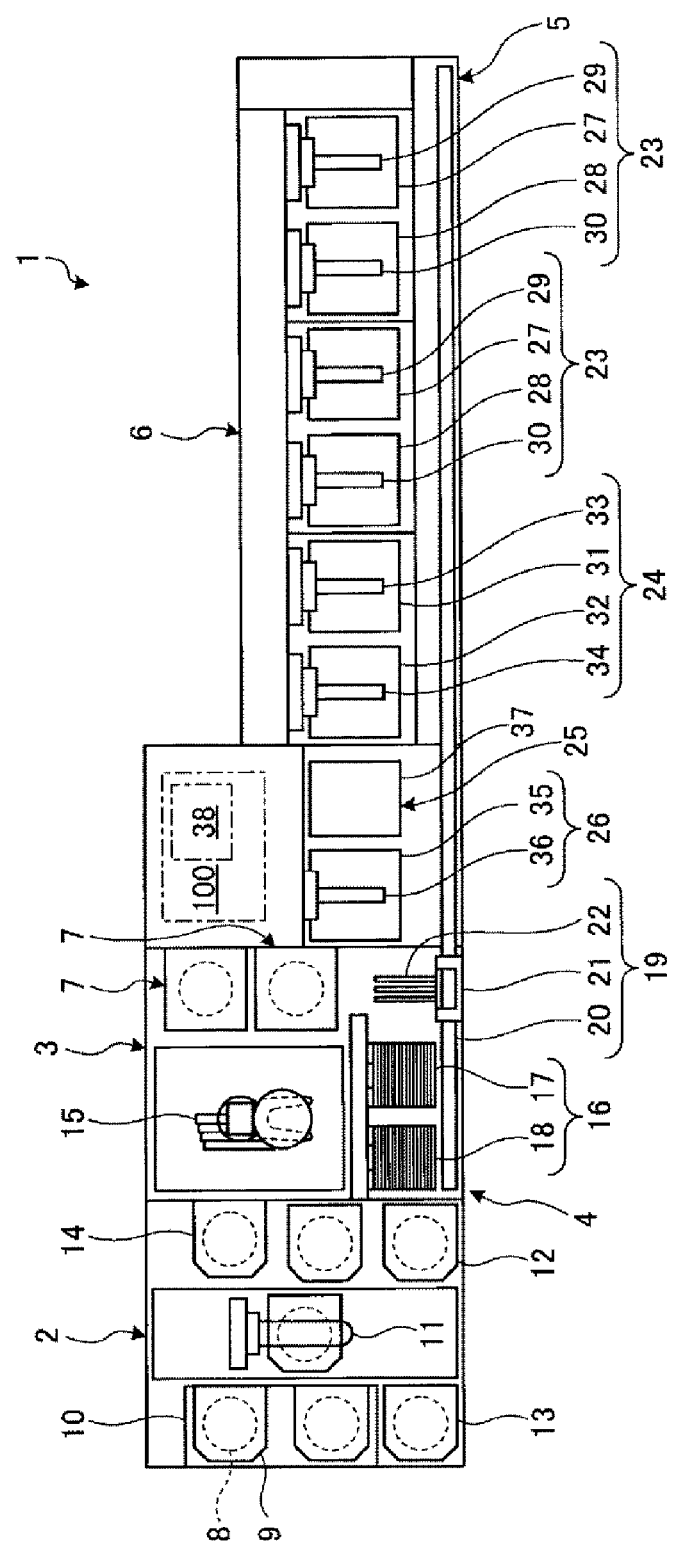
FIG. 7 is a schematic plan view of a substrate liquid processing apparatus according to a modification example.

In the above-described exemplary embodiment, one substrate rotating unit 7 is provided. However, the exemplary embodiment is not limited thereto, and multiple substrate rotating units 7 may be provided. By way of example, as depicted in FIG. 7, two substrate rotating units 7 may be provided. FIG. 7 is a schematic plan view of the substrate liquid processing apparatus 1 according to a modification example.

The two substrate rotating units 7 may be provided within the lot forming unit 3, for example.

By providing the multiple substrate rotating units 7, the increase of the total processing time can be suppressed. By way of example, in case of transferring the multiple number (e.g., 50 sheets) of substrates 8 belonging to the lot with the substrate transfer device 15 two times by dividing them in half, a time required to rotate all of the substrates 8 belonging to the lot can be shortened as compared to a time required to rotate the substrates 8 by using the single substrate rotating unit 7. Therefore, the increase of the total processing time can be suppressed.

Figure 8:
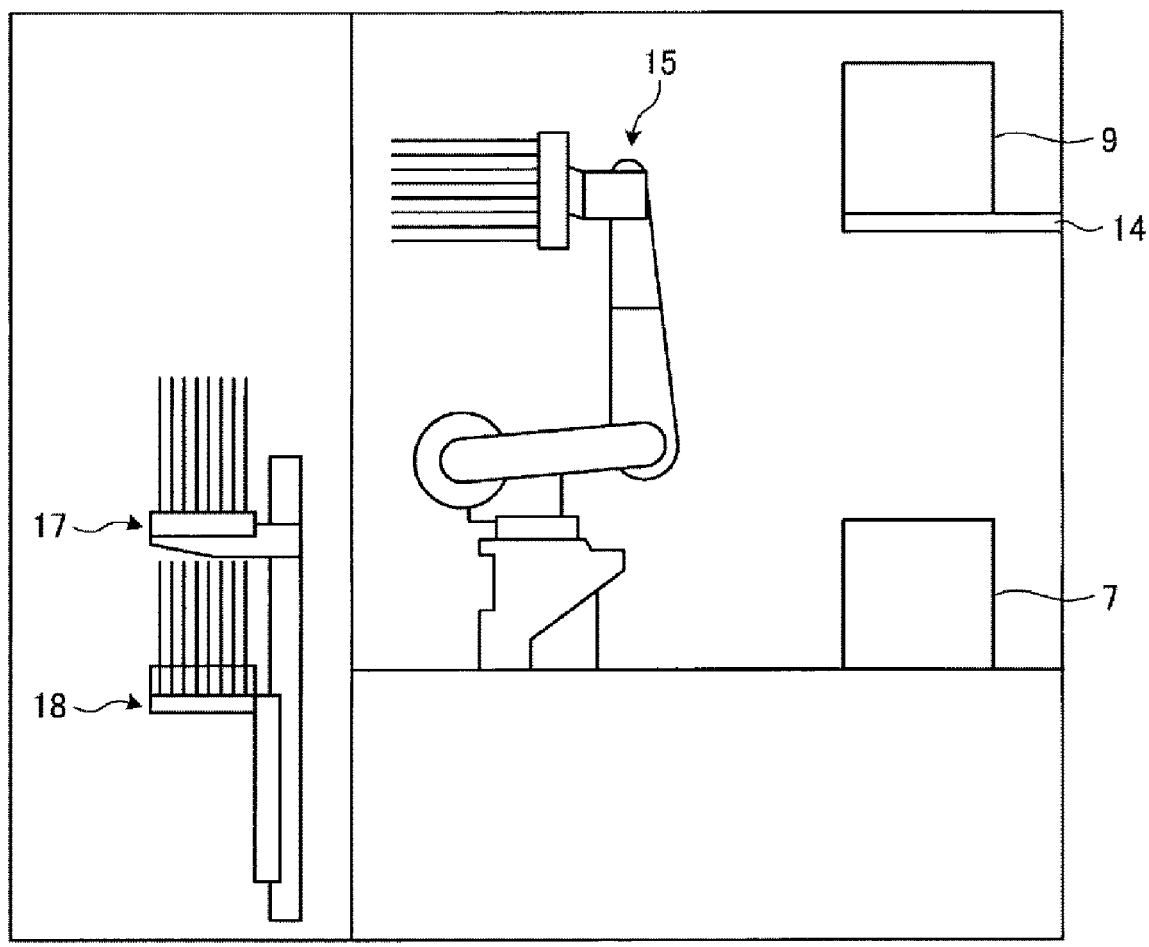
FIG. 8 is a schematic side view illustrating a part of a substrate liquid processing apparatus according to a modification example.

In the above-described exemplary embodiment, though the substrate rotating unit 7 is provided within the lot forming unit 3, the arrangement location of the substrate rotating unit 7 may not be limited thereto. For example, the substrate rotating unit 7 can be placed in any empty space within the substrate liquid processing apparatus 1 as long as the substrate rotating unit 7 is capable of accommodating therein a plurality of substrates 8 in, e.g., the horizontal posture and rotating these substrates 8 around the axis perpendicular to the plate surfaces of the substrates 8. By way of non-limiting example, as shown in FIG. 8, the substrate rotating unit 7 may be provided under the carrier placing table 14. FIG. 8 is a schematic side view illustrating a part of the substrate liquid processing apparatus 1 according to a modification example.

By placing the substrate rotating unit 7 in the empty space within the substrate liquid processing apparatus 1, the scale-up of the substrate liquid processing apparatus 1 can be suppressed.

Figure 9:
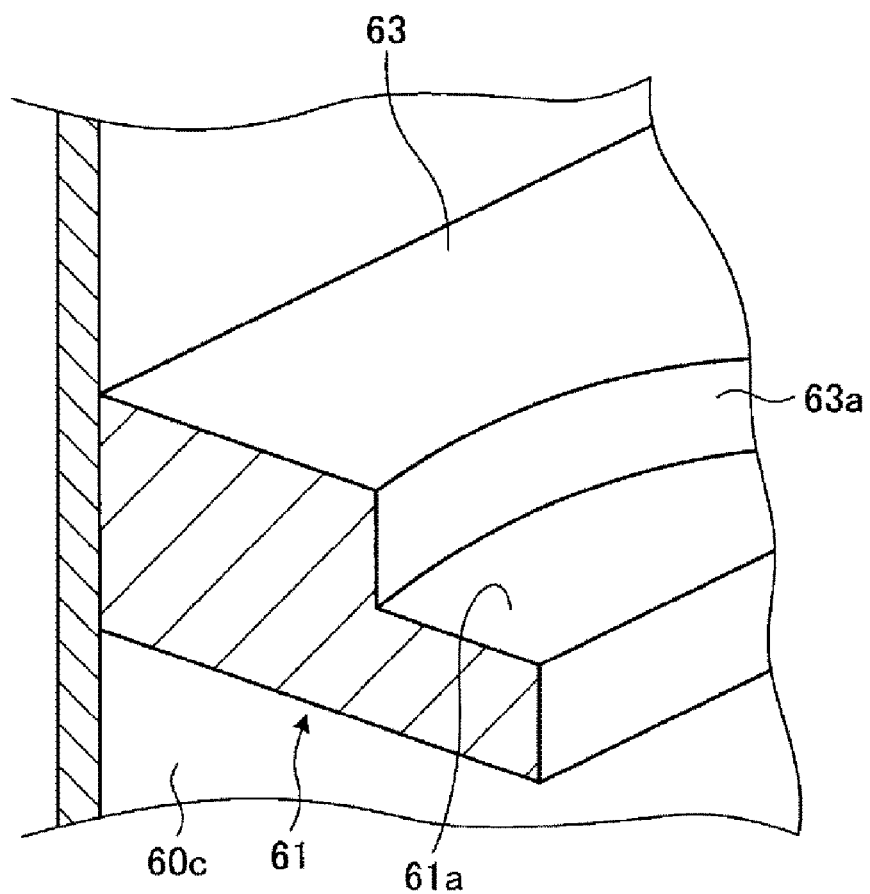
FIG. 9 is a sectional perspective view illustrating a part of a substrate rotating unit according to a modification example.

Furthermore, each supporting member 61 of the substrate rotating unit 7 may have a protruding portion 63 as illustrated in FIG. 9. FIG. 9 is a sectional perspective view illustrating a part of the substrate rotating unit 7 according to a modification example.

The protruding portion 63 may be protruded upwards from an outer side of a placing surface 61a on which the substrate 8 is placed, and an inner wall 63a is formed along a circumferential edge of the substrate 8 (see FIG. 1). By providing the protruding portion 63, a position of each substrate 8 can be suppressed from being deviated from the placing surface 61a during the rotation thereof.

If the substrates 8 are transferred by the substrate transfer device 15 in a state that the position of each substrate 8 is deviated from the placing surface 61a, the substrates 8 may be moved and rotated around the axis perpendicular to the plate surfaces of the substrates 8 and thus be deviated from a required position (rotation angle) when the substrates 8 are carried out of the substrate rotating unit 7 by the substrate transfer device 15 or when the substrates 8 are placed on the carry-in side lot placing table 17.

The substrate rotating unit 7 according to the present modification example is configured to suppress such a position deviation of the substrates 8. Further, since the second processing can be performed on the substrates 8 after inverting the substrates 8 in the vertical direction with respect to the substrates 8 at the time of the first processing, the non-uniformity of the processing can be reduced.

Figure 10:
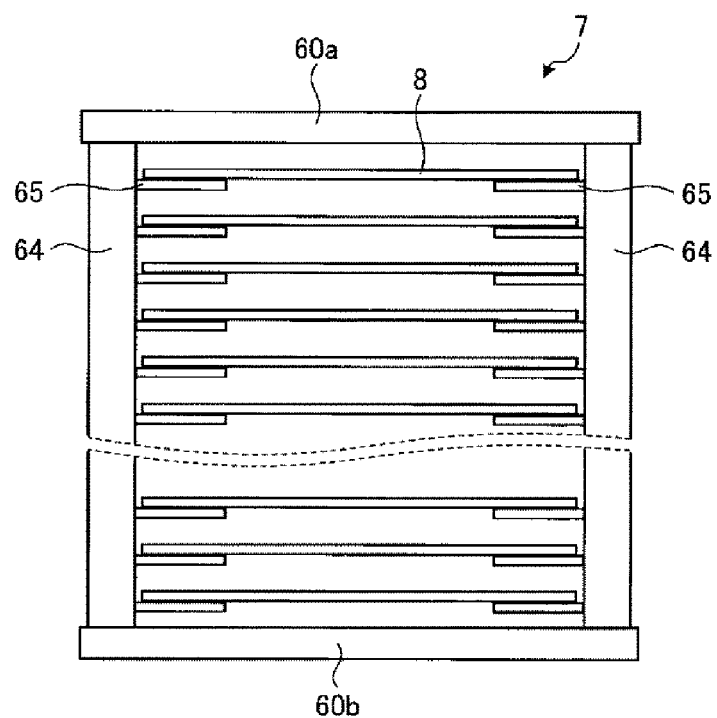
FIG. 10 is a schematic side view of a substrate rotating unit according to a modification example.
Figure 11:
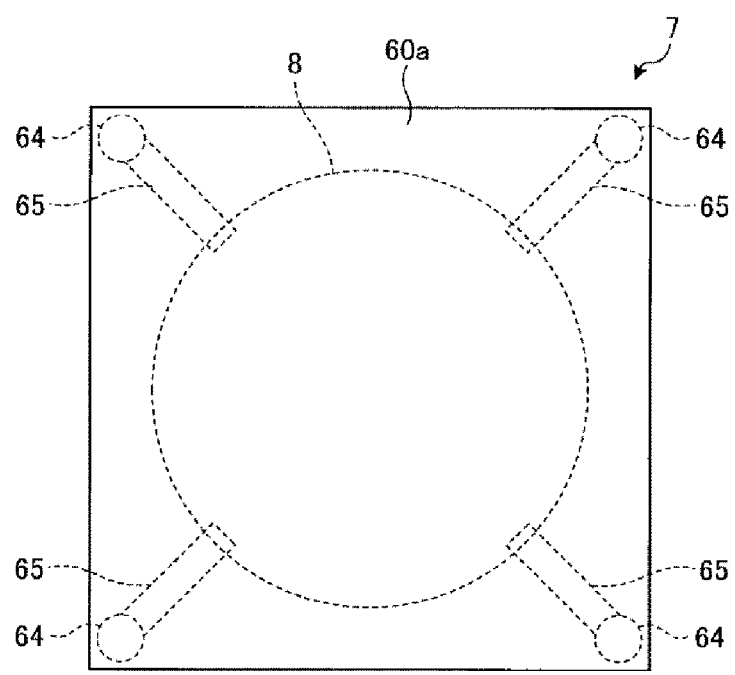
FIG. 11 is a schematic plan view of the substrate rotating unit according to the modification example.

In the above-described exemplary embodiment, the plurality of substrates 8 are rotated 180° by the substrate rotating unit 7. However, the rotation angle is not limited thereto. By way of non-limiting example, the substrates 8 may be rotated at an angle of 90°. In such a case, the substrate rotating unit 7 may have the top surface portion 60a, the bottom surface portion 60b and four connecting portions 64 connecting the top surface portion 60a and the bottom surface portion 60b, as illustrated in FIG. 10 and FIG. 11. FIG. 10 is a schematic side view of the substrate rotating unit 7 of a modification example, and FIG. 11 is a schematic plan view of the substrate rotating unit 7 of the modification example.

The connecting portions 64 are arranged at a regular distance therebetween to allow the plurality of substrates 8 to be carried in and out by the substrate transfer device 15 from the same direction in case of rotating the substrate rotating unit 70 by 90°.

Further, each connecting portion 64 has a supporting member 65 protruded toward a center. In the substrate rotating unit 7 according to this modification example, the single substrate 8 is supported by the supporting members 65 of the respective connecting portions 64, that is, by four supporting members 65.

In this modification example, the single processing is performed by being divided into four sub-processings. In each of the four sub-processings, an immersion time in the processing tub 27 (see FIG. 1) is set to be a quarter (¼) of the immersion time which is set when the etching processing is completed by the single processing.

In the above-described exemplary embodiment, the first processing and the second processing are performed in the same processing tub 27. When immersing the lot, however, the lot may be immersed in the empty processing tub 27 in which no lot is immersed. Accordingly, the total processing time can be shortened.

Furthermore, in the above-described exemplary embodiment, the substrate liquid processing apparatus 1 has the plurality of etching apparatuses 23. However, the substrate liquid processing apparatus 1 may have the single etching apparatus 23.

In addition, in the above-described exemplary embodiment, the etching processing is performed by using the phosphoric acid aqueous solution. However, the exemplary embodiment is not limited thereto. By way of non-limiting example, the etching processing may be performed by using a chemical liquid such as DHF or SC-1.

Moreover, in the above-described exemplary embodiment, the substrate liquid processing apparatus 1 is configured to process the substrates 8 at the same time. However, the exemplary embodiment is not limited thereto. The substrate liquid processing apparatus 1 may process the substrates 8 one by one.

Modification examples to be described below may be further applied to the aforementioned modification examples.

In the substrate rotating unit 7, anti-slip processing may be performed on the surfaces of the supporting members 61 such that the substrate 8 is not rotated with respect to the supporting members 61. Further, an anti-slip member may be provided at each supporting member 61.

With this configuration, while suppressing each substrate 8 from being rotated with respect to the supporting members 61 and not causing the deviation of the substrate 8 from the supporting members 61, the rotation speed of the substrate rotating unit 7 can be increased, so that the total processing time can be shortened.

Further, the single lot may be formed of the multiple (e.g., 25 sheets) substrates 8 accommodated in the single carrier 9. Further, the substrate rotating unit 7 may be configured to accommodate therein the multiple (e.g., 50 sheets) substrates 8 belonging to the single lot.

Furthermore, the substrate liquid processing apparatus 1 may be configured to arrange notches formed on the multiple substrates 8 by using a notch aligner. In this case, the multiple substrates 8 may be aligned by using the notch aligner before the first processing is performed. When performing the second processing, the notch aligner is not used, and the second processing is performed after the substrates 8 are rotated by the substrate rotating unit 7.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A substrate liquid processing apparatus, comprising:
   a placing unit configured to place thereon a substrate carried in from outside;
   a liquid processing unit configured to process the substrate by immersing the substrate in a processing liquid with a posture in which a plate surface of the substrate is perpendicular to a horizontal direction and a first portion of the substrate faces downwards;
   at least one case configured to accommodate multiple number of substrates therein, after being subjected to a first processing by the liquid processing unit;
   a transfer unit configured to transfer the substrate between the placing unit, the liquid processing unit, and the at least one case;
   and
   a control unit configured to:
      control the transfer unit to transfer the substrate, after being subjected to the first processing by the liquid processing unit, to the at least one case from the liquid processing unit,
      control a driving unit to rotate the at least one case, with respect to an axis perpendicular to the plate surface of the substrate,
      control the transfer unit to transfer the substrate, which has been rotated by the at least one case, to the liquid processing unit from the at least one case, and
      control the liquid processing unit to perform a second processing by immersing the substrate, which has been rotated by the at least one case, with a posture in which a second portion of the substrate that is different from the first portion faces downwards in the processing liquid.

2. The substrate liquid processing apparatus of claim 1, wherein multiple openings are formed at the case such that the substrate is carried into and carried out of the case from a same direction.

3. The substrate liquid processing apparatus of claim 1, wherein the at least one case rotates the substrate by 180° with respect to the axis perpendicular to the plate surface of the substrate.

4. The substrate liquid processing apparatus of claim 1, wherein the at least one case is plural in number.

5. The substrate liquid processing apparatus of claim 1, wherein the at least one case comprises a supporting member, at inner side walls thereof, to support a bottom surface of the substrate, and
   the supporting member comprises an upper step and a lower step on which the substrate is placed.

6. The substrate liquid processing apparatus of claim 1, further comprising:
   a drying unit configured to dry the substrate,
   wherein the transfer unit transfers the substrate, which is dried by the drying unit, to the at least one case.

7. The substrate liquid processing apparatus of claim 1, wherein the liquid processing unit performs the first processing and the second processing under a same processing condition.

8. The substrate liquid processing apparatus of claim 1, wherein the liquid processing unit comprises multiple liquid processing tubs in which a same processing liquid is stored, and
   the first processing and the second processing are performed on a same substrate in a same processing tub.

9. The substrate liquid processing apparatus of claim 1, wherein the liquid processing unit comprises multiple liquid processing tubs in which a same processing liquid is stored, and
   the substrate is immersed in, among the multiple liquid processing tubs, a liquid processing tub in which any substrate is not immersed.

10. The substrate liquid processing apparatus of claim 1, wherein the liquid processing unit comprises a liquid supply nozzle configured to discharge the processing liquid along the plate surface of the substrate.

11. A substrate liquid processing method, comprising:
    transferring a substrate by using a transfer unit from a placing unit configured to place thereon the substrate carried in from outside to a liquid processing unit configured to process the substrate by immersing the substrate in a processing liquid with a posture in which a plate surface of the substrate is perpendicular to a horizontal direction and a first portion of the substrate faces downwards;
    performing a first processing, in the liquid processing unit, by immersing the substrate in the processing liquid;
    transferring the substrate, after being subjected to the first processing, from the liquid processing unit to a case configured to accommodate multiple number of substrates therein by using the transfer unit;
    rotating the case with respect to an axis perpendicular to the plate surface of the substrate by a control unit;
    the control unit controlling a transfer unit to transfer the substrate, which has been rotated by the case, from the case to the liquid processing unit; and
    the control unit controlling a liquid processing unit to perform a second processing by immersing the substrate, which has been rotated by the case, with a posture in which a second portion of the substrate that is different from the first portion faces downwards in the processing liquid.

* * * * *